(12) United States Patent
West et al.

(10) Patent No.: US 8,415,792 B2
(45) Date of Patent: Apr. 9, 2013

(54) ELECTRICAL CONTACT ALIGNMENT POSTS

(75) Inventors: David Justin West, Essex Juncton, VT (US); David John Russell, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 12/850,404

(22) Filed: Aug. 4, 2010

(65) Prior Publication Data

US 2012/0032321 A1 Feb. 9, 2012

(51) Int. Cl.
*H01L 23/48* (2006.01)

(52) U.S. Cl. ........ 257/737; 257/738; 257/777; 257/797; 257/E23.023; 257/E21.515; 438/612; 438/116; 438/108

(58) Field of Classification Search ................. 257/737, 257/738, 777, 797, E23.023, E21.515; 438/612, 438/116, 108
See application file for complete search history.

(56) References Cited

U.S. PATENT DOCUMENTS

| | | | |
|---|---|---|---|
| 3,871,015 A | 3/1975 | Lin et al. | |
| 5,173,763 A | 12/1992 | Cipolla et al. | |
| 5,381,307 A | 1/1995 | Hertz et al. | |
| 6,395,991 B1 | 5/2002 | Docket et al. | |
| 6,444,563 B1 | 9/2002 | Potter et al. | |
| 6,750,549 B1 | 6/2004 | Chandran et al. | |
| 6,864,165 B1 | 3/2005 | Pogge et al. | |
| 6,940,176 B2 | 9/2005 | Chen | |
| 7,223,681 B2 | 5/2007 | Hussa | |
| 7,675,147 B1 | 3/2010 | Hubbard et al. | |
| 2001/0000646 A1* | 5/2001 | Akram et al. | 324/758 |
| 2004/0108364 A1* | 6/2004 | Ference et al. | 228/180.22 |
| 2006/0113668 A1* | 6/2006 | Ishikawa et al. | 257/737 |

OTHER PUBLICATIONS

A. Yeoh et al., "Copper die bumps (first level interconnect) and low-K dielectrics in 65nm high volume manufacturing," Proceedings of ECTC 2006, pp. 1611-1615.

* cited by examiner

*Primary Examiner* — Tu-Tu Ho
(74) *Attorney, Agent, or Firm* — Thomas E. Tyson; Steven L. Bennett

(57) ABSTRACT

An electronic apparatus and method of fabrication of the apparatus, the apparatus including a first electronic device having an interconnection surface with a first plurality of interconnection pads extending from the surface by a first distance and a second plurality of alignment posts extending from the surface by a second distance greater than the first distance, and a second electrical device having an interconnection surface with a first plurality of electrical interconnection pads, each pad arranged to contact a corresponding first electronic device interconnection surface pad upon assembly of the first electronic device interconnection surface upon the second electronic device interconnection surface, the second electronic device interconnection surface including a third plurality of alignment posts, each located to be adjacent to at least one of the first electronic device alignment posts upon assembly.

9 Claims, 6 Drawing Sheets

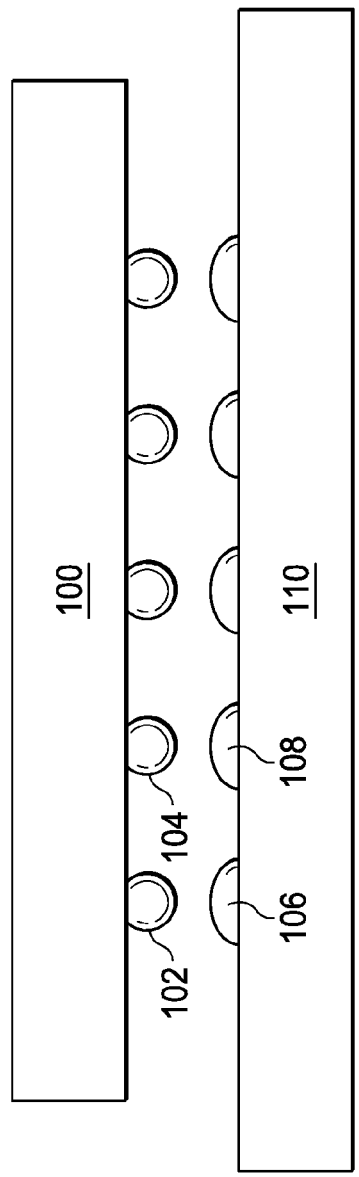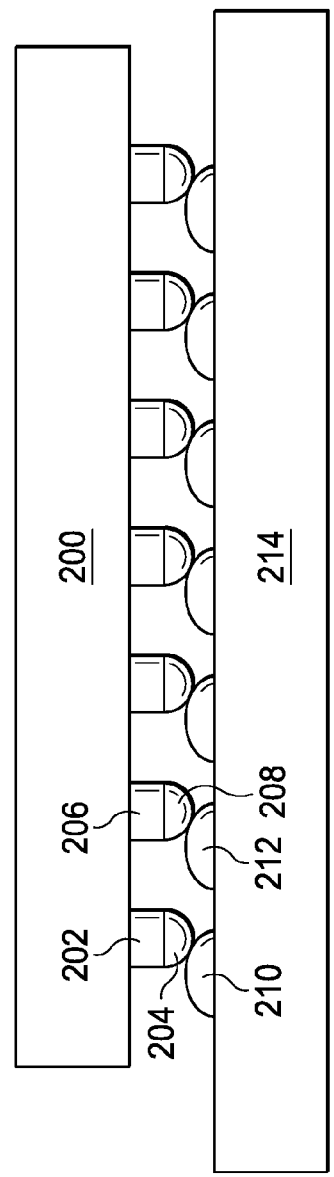

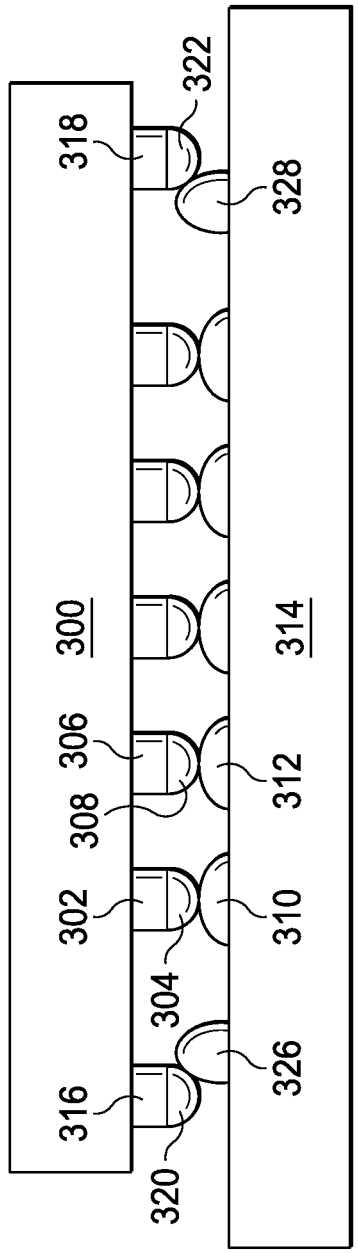
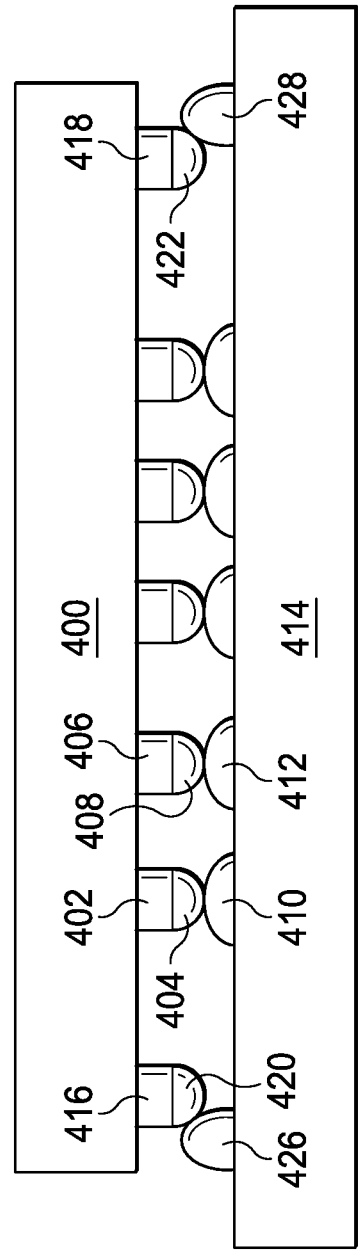

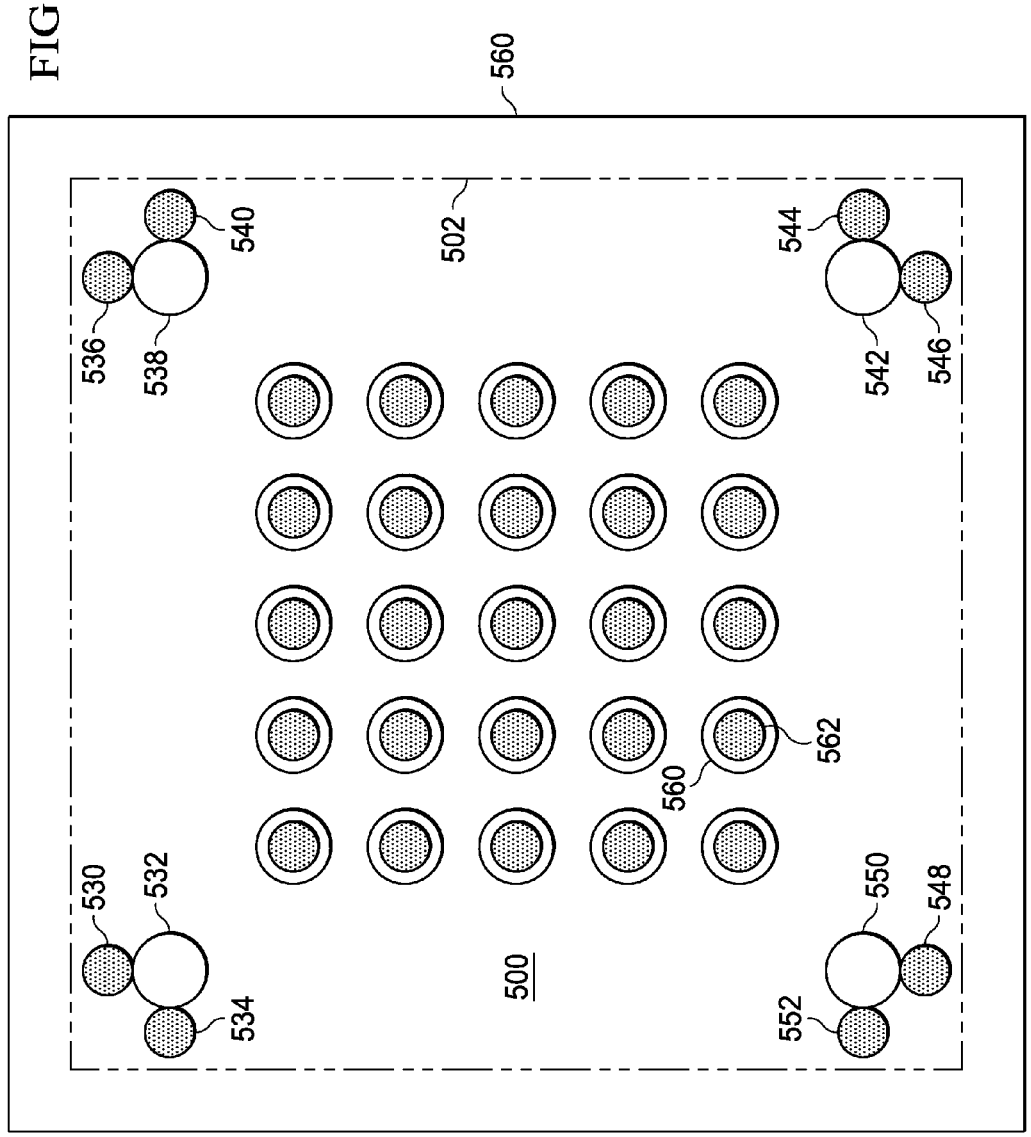

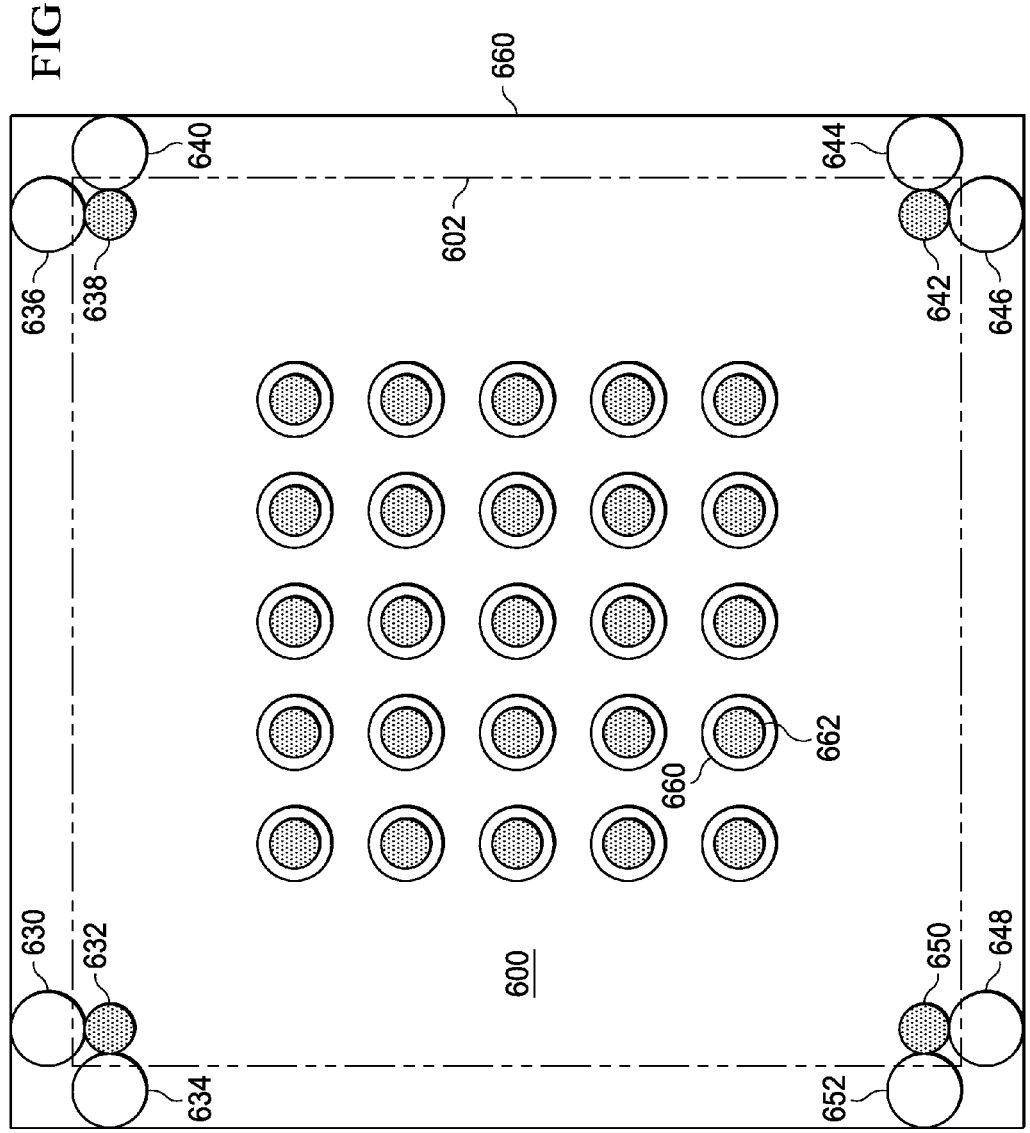

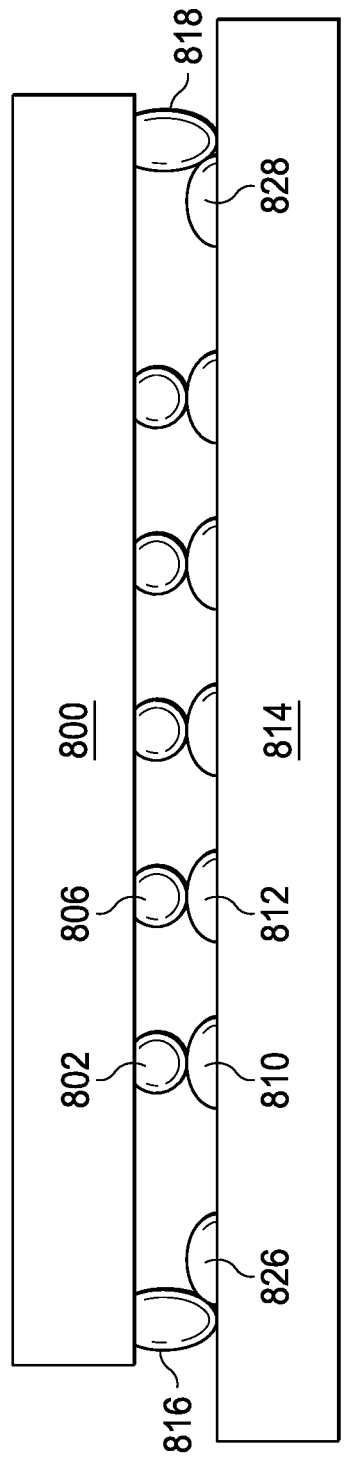

ELECTRICAL CONTACT ALIGNMENT POSTS

RELATED APPLICATION

This application is related to the following co-pending U.S. patent application having the same assignee: "OVERCOMING LAMINATE WARPAGE AND MISALIGNMENT IN FLIP-CHIP PACKAGES," (U.S. patent application Ser. No. 11/671,485 filed Dec. 18, 2009).

BACKGROUND OF THE INVENTION

1. Technical Field

The present invention relates to integrated circuitry manufacturing. In particular, the present invention relates to semiconductor packaging.

2. Description of the Related Art

Integrated circuit products include a manufactured semiconductor device or 'chip' mounted onto a package in order to provide electronic signal, power and ground interconnections to other devices for electronic product manufacture. This requires that the semiconductor chip be physically and electrically interconnected the packaging containing a substrate. The chip includes pads that each provide for a signal or power/ground interconnection to corresponding pads located on the substrate. Typically a solder alloy is provided on the semiconductor chip pads and on the substrate pads that are to be interconnected. Interconnection is provided during an assembly process by placing the chip pads onto the substrate pads using a high temperature to melt and reflow the solder from the semiconductor chip and the substrate to join the chip to the substrate and electrically interconnect the pads.

In some assembly processes the substrate pads include solid solder which is fabricated by applying presolder which is reflowed as part of the laminate fabrication process. When presolder is used, the reflowed solder forms domes or hemispheres due to the surface tension of the molten solder during the reflow process. FIG. 1 illustrates a chip 100 including solder bumps or domes such as 102 and 104 and a substrate 110 including solder bumps or domes 106 and 108. FIG. 2 illustrates a chip 200 including pillars 202 and 206 with solder bumps 204 and 208. In FIG. 2, the substrate 214 includes solder bumps or domes 210 and 212 similar to the substrate 110 in FIG. 1. FIG. 2 illustrates that placing the chip 200 onto the substrate 214 can result in misalignment caused by the bump or dome shapes on both the chip and semiconductor sliding laterally when during assembly resulting in a lateral shift of the chip relative to the substrate.

One prior art solution has been to flatten the bumps or domes on the substrate. This process is referred to as bump flattening or coining. However, coining adds an extra process step and requires specialized equipment. Also, coining can be a contributor to yield loss during laminate fabrication. Therefore the addition of the coining process step is expensive and can result in lower yield.

Further, as technology progresses, semiconductor chips have become more complex and chip size has decreased. This results in a greater number of smaller interconnection pads on a smaller chip surface. Therefore, alignment of the chip interconnection pads with the corresponding interconnection pads of the substrate becomes a greater challenge.

SUMMARY

In accordance with the present invention, an electronic apparatus is provided that includes a first electronic device having an interconnection surface with a first plurality of interconnection pads extending from the surface by a first distance and a second plurality of alignment posts extending from the surface by a second distance greater than the first distance, and a second electrical device having an interconnection surface with a first plurality of electrical interconnection pads, each pad being arranged to contact a corresponding first electronic device interconnection surface pad upon assembly of the first electronic device interconnection surface upon the second electronic device interconnection surface, the second electronic device interconnection surface including a third plurality of alignment posts, each located to be adjacent to at least one of the first electronic device alignment posts upon assembly.

BRIEF DESCRIPTION OF THE DRAWINGS

The present invention may be better understood, and its numerous objects, features, and advantages made apparent to those skilled in the art by referencing the accompanying drawings.

FIG. 1 is a side view illustration of a prior art assembly of a chip upon a substrate;

FIG. 2 is a side view illustration of a prior art assembly of a chip including pillars upon a substrate;

FIG. 3 is a side view illustration of a chip including alignment posts and a substrate with alignment bumps;

FIG. 4 is a side view illustration of a second embodiment of a chip including alignment posts and a substrate with alignment bumps;

FIG. 5 is a top view illustration of the chip including alignment posts and a substrate with alignment bumps of FIG. 3;

FIG. 6 is a top view illustration of the second embodiment of the chip including alignment posts and a substrate with alignment bumps of FIG. 4;

FIG. 8 is a side view illustrating another embodiment of a chip with alignment bumps and a substrate will alignment bumps.

DETAILED DESCRIPTION

Figure 7:
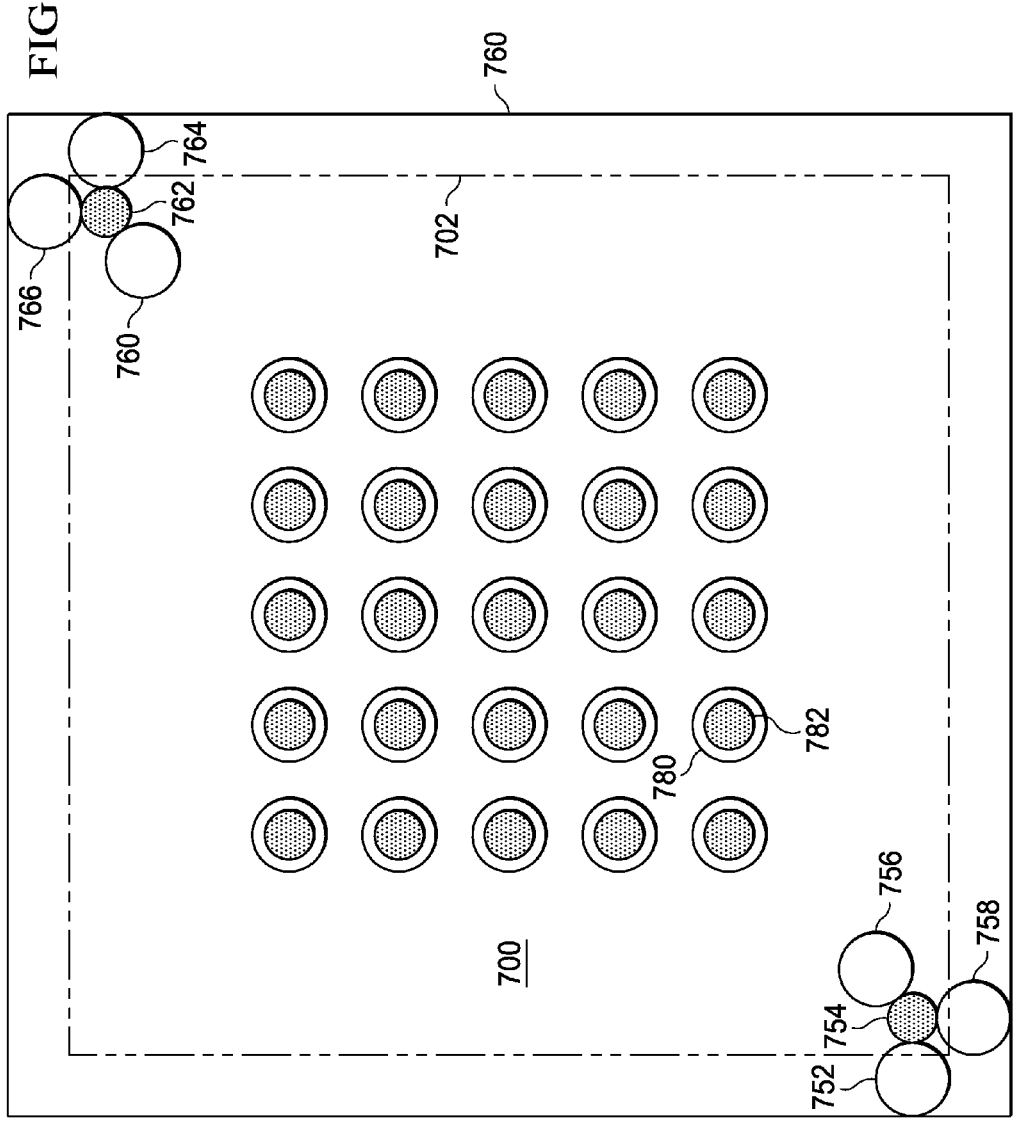
FIG. 7 is a top view illustration of a third embodiment of a chip including alignment posts and a substrate with alignment bumps.

The following is intended to provide a detailed description of an example of the invention and should not be taken to be limiting of the invention itself. Rather, any number of variations may fall within the scope of the invention, which is defined in the claims following the description.

The present invention is a structure and method for fabricating an assembly of two electronic devices that include interconnections to be joined during an assembly of the two devices together to form a composite electronic device. The devices include interconnection pads and/or bumps of solder that when the devices are placed together and reflowed form connections between the devices. Additionally, these devices include bumps or posts that engage with bumps or posts of the other device to provide alignment and lateral stability during assembly.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Semiconductor integrated circuits or chips are assembled with substrates to produce electronic packages used in electronic products. As discussed, the chip is assembled on a substrate to provide signal connections along with power and ground connections. These assemblies include a Flip-chip Plastic Ball Grid Array where the substrate includes interconnection pads that have presolder or solder on pad (SOP) to provide a solder connection with corresponding interconnection pads of a chip. One method to manufacture the substrate is to screen solder paste through a stencil and then melt the solder to reflow the solder on the substrate interconnection pads. Other methods of substrate manufacture are known by those of skill in the art and may also be used. The resulting solder on the substrate pads form hemispherical domes due to surface tension of the solder when the solder is melted and reforms. When a semiconductor chip, which also has presolder located on its connection pads, is placed onto the substrate, misalignment can occur before or during the assembly and reflow process. The present invention addresses this problem by providing alignment posts or bumps that engage when the chip is placed on the substrate to accurately self-align the chip interconnection pads with the substrate pads during assembly and to prevent the chip from moving sideways relative to the substrate during the assembly and reflow process.

FIG. 3 is a side view of one of the preferred embodiments of the invention showing a chip 300 having alignment posts 316 and 318 that include solder bumps or domes 320 and 322. These alignment posts 316 and 318 are copper pillars that are formed on the chip 300 surface along with other interconnection pads such as pad 302 and 306 that also include solder bumps or domes 304 and 308. Substrate 314 also includes alignment bumps 326 and 328 formed on the substrate 314 along with interconnection bumps such as 310 and 312. During assembly when chip 300 is placed onto substrate 314, the alignment post 316 with bump 320 and alignment post 318 with bump 322 engage the substrate 314 alignment bump 326 and alignment bump 328 respectively to align chip 300 interconnection pillars 302 and 306 and their respective bumps 304 and 308 with the substrate 314 interconnection bumps 310 and 312 respectively. This arrangement also prevents sideways motion of the chip relative to the substrate that may occur during the assembly and reflow process.

FIG. 4 is a side view of another embodiment wherein chip 400 includes alignment posts 416 and 418 having solder bumps 420 and 422 that engage substrate 414 alignment bumps 426 and 428 respectively to align the substrate interconnection bumps such as 410 and 412 with the chip 400 interconnection pillars 402 and 406 with their bumps 404 and 408. It should be understood with both FIGS. 3 and 4 that the substrate interconnection bumps may include substrate interconnection pads.

In one method, the substrate alignment bumps in FIGS. 3 and 4 are formed by using a stencil or metal mask, such as stainless steel, with openings to form the interconnection pads upon the substrate. Other methods to form bumps known to those of skill in the art may also be used. A screen printing process is used to force solder paste into the stencil openings onto the interconnection pads. The solder paste volume can be controlled by varying the thickness of the stencil and the size of the stencil openings. Also, more presolder can be added to increase thermal cycling fatigue life along with increasing the strength of the bump. Similar techniques can be used in forming bumps on the chip surface.

In the preferred embodiment illustrated by FIG. 3, chip corners are used as the location of the alignment posts such as 316 and 318. This is shown in FIG. 5 which illustrates a chip 500 on top of a substrate 560. For the purposes of this illustration, the chip 500 is only shown with its perimeter 502 and includes the interconnection pillars such as 562 and chip alignment posts 530, 534, 536, 540, 544, 546, 548 and 552 located at the corners of the chip 500. Also in FIG. 5, substrate 560 is shown including interconnection bumps such as bump 560 and alignment bumps 532, 538, 542 and 550. Alignment bump 532 will engage alignment posts 530 and 534. The other alignment bumps 538, 542 and 550 with engage alignment posts 536,540; 544, 546; and 548 and 552 respectively to assist in the aligning of the chip interconnection pillars such as pillar 562 with the substrate interconnection bumps such as bump 560 during assembly of the chip onto the substrate. Further the substrate alignment bump/chip alignment post corner structure will prevent lateral or sideways motion between the chip 500 and substrate 560.

FIG. 6 is a top view arrangement for the assembly in FIG. 4. The chip 500 boundary perimeter 602 includes alignment posts 632, 638, 642 and 650 which engage alignment bump pairs such as 630, 634; 636, 640; 644, 646; and 648, 652 respectively to align the chip 600 interconnection pillars such as pillar 662 with the corresponding substrate 660 interconnection bumps 660.

FIG. 7 is a top view of another embodiment of the present invention that is an alternative to the four corner structures illustrated in FIGS. 5 and 6. In FIG. 7, chip 700 with its border perimeter 702 includes interconnection pillars such as interconnection pillar 782 and alignment posts 754 and 762. Substrate 760 includes interconnection bumps such as interconnection bump 780 and alignment bumps 752, 756 and 758 along with alignment bumps 760, 764 and 766. The three alignment bumps 752, 756 and 758 engage chip 700 alignment post 754 while the three alignment bumps 760, 764 and 766 engage alignment post 762. Thus 6 alignment bumps rather than 8 alignment bumps in FIG. 6 would provide alignment and lateral stability. It should be apparent to those of skill in the art that other various combinations of alignment structures on the substrate and the chip would also provide alignment and lateral stability and that these other structures are within the scope of this invention.

A further embodiment is illustrated in FIG. 8 which is a side view illustrating a configuration similar to FIG. 3 except that the chip 800 does not include any pillars. Instead chip 800 includes interconnection bumps such as bumps 802 and 806 that are intended to connect to substrate 814 interconnection bumps 810 and 812 respectively. Chip 800 also includes alignment bumps 816 and 818 which are fabricated to be of a greater height than the chip 800 interconnection bumps such as bumps 802 and 806. This additional height will assist in alignment during assembly. Substrate 814 includes alignment bumps 826 and 828 that will engage chip 800 alignment bumps 816 and 818 during assembly. In one further embodiment, alignment bumps 826 and 828 are wider than the interconnection substrate bumps such as bumps 810 and 812.

The larger volume in height and width of alignment bumps results from additional presolder volume added during fabrication. When the reflow process occurs, the larger size of these alignment bumps will result in these bumps being better to resist fatigue cracking.

In the embodiments discussed, the alignment posts and alignment bumps are not interconnected to any signal wiring in either the chip or the substrate. However, given their size and sturdiness, these alignment posts and bumps could be interconnected to signals or power or ground connections.

While particular embodiments of the present invention have been shown and described, it will be obvious to those skilled in the art that based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

The invention claimed is:

1. An electronic apparatus comprising:
a first electronic device having an interconnection surface with a first plurality of interconnection pads extending from the surface by a first distance and terminating with dome shaped solder and a second plurality of alignment posts extending from the surface by a second distance greater than the first distance and wherein the second plurality of alignment posts terminate with dome shaped solder, and
a second electronic device having an interconnection surface with a first plurality of electrical interconnection pads terminating with dome shaped solder, each pad arranged to contact a corresponding first electronic device interconnection surface pad upon assembly of the first electronic device interconnection surface upon the second electronic device interconnection surface, the second electronic device interconnection surface including a third plurality of alignment posts wherein the third plurality of alignment posts terminate with dome shaped solder and each of said alignment posts located to be adjacent to at least one of the first electronic device alignment posts upon assembly.

2. The electronic apparatus according to claim 1 wherein the the second plurality of alignment posts and the third plurality of alignment posts are arranged to prevent lateral motion between the first electronic device and second electronic device interconnection surfaces relative to each other at assembly.

3. The electronic apparatus according to claim 1 wherein the first device and second device alignment posts are positioned to align the first device plurality of interconnection pads with the corresponding second device interconnection pads during assembly.

4. The electronic apparatus according to claim 1 wherein the first electronic device alignment posts are located at the perimeter of the first plurality of interconnection pads.

5. An electronic apparatus comprising:
an integrated circuit semiconductor having an interconnection surface with a first plurality of interconnection dome shaped solder bumps extending from the surface by a first distance and a second plurality of alignment dome shaped solder bumps located upon the perimeter of the first plurality of interconnection dome shaped solder bumps and extending from the surface by a second distance greater than the first distance, and
a substrate having an interconnection surface with a first plurality of electrical interconnection dome shaped solder bumps, each dome shaped solder bump arranged to contact a corresponding integrated circuit semiconductor interconnection dome shaped solder bump upon assembly of the integrated circuit semiconductor surface upon the substrate surface, the substrate surface including a third plurality of alignment dome shaped solder bumps, each located to be adjacent to at least one of the integrated circuit semiconductor alignment dome shaped solder bumps upon assembly.

6. The electronic apparatus according to claim 5 wherein the integrated circuit semiconductor and substrate alignment dome shaped solder bumps are arranged to prevent lateral motion between the first and second surfaces relative to each other at assembly.

7. The electronic apparatus according to claim 5 wherein the integrated circuit semiconductor and substrate alignment dome shaped solder bumps are positioned to align the integrated circuit semiconductor plurality of interconnection dome shaped solder bumps with the corresponding substrate interconnection bumps during assembly.

8. The electronic apparatus according to claim 5 wherein the substrate alignment interconnection dome shaped solder bumps are wider than the substrate interconnection dome shaped solder bumps.

9. The electronic apparatus according to claim 5 wherein the integrated circuit semiconductor alignment dome shaped solder bumps include a pillar mounted upon the semiconductor surface.

* * * * *